United States Patent
Stein et al.

(10) Patent No.: US 7,158,324 B2
(45) Date of Patent: Jan. 2, 2007

(54) SELF-ADJUSTING PRML RECEIVER

(75) Inventors: Anatoli B. Stein, Atherton, CA (US); Semen P. Volfbeyn, Milpitas, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 10/945,393

(22) Filed: Sep. 20, 2004

(65) Prior Publication Data

US 2006/0061496 A1    Mar. 23, 2006

(51) Int. Cl.
    *G11B 27/36*    (2006.01)
(52) U.S. Cl. ........................................ 360/31
(58) Field of Classification Search ...................... None
    See application file for complete search history.

(56) References Cited

U.S. PATENT DOCUMENTS

| | | | |
|---|---|---|---|
| 5,341,387 A | 8/1994 | Nguyen | |
| 5,440,433 A | 8/1995 | Yun | |
| 5,493,454 A | 2/1996 | Ziperovich et al. | |
| 5,583,705 A | 12/1996 | Ziperovich et al. | |
| 5,588,011 A | 12/1996 | Riggle | |
| 5,610,776 A | 3/1997 | Oh | |
| 5,822,689 A * | 10/1998 | Hwang | 340/7.34 |
| 5,889,823 A | 3/1999 | Agazzi et al. | |
| 5,954,837 A | 9/1999 | Kim | |
| 5,995,544 A | 11/1999 | Cherubini et al. | |
| 6,201,840 B1 * | 3/2001 | Rub et al. | 714/795 |
| 6,249,398 B1 | 6/2001 | Fisher et al. | |
| 6,393,598 B1 | 5/2002 | Tsang et al. | |
| 6,594,094 B1 * | 7/2003 | Rae et al. | 360/25 |
| 6,600,617 B1 | 7/2003 | Zeng | |
| 6,771,570 B1 * | 8/2004 | Wong et al. | 369/30.1 |

* cited by examiner

*Primary Examiner*—Wayne Young
*Assistant Examiner*—Glenda P. Rodriquez
(74) *Attorney, Agent, or Firm*—Mark G. Lappin; Foley & Lardner LLP (57) ABSTRACT

A partial response maximum likelihood (PRML) data detecting in a magnetic recording storage device is carried out with a preliminary measuring of write-read channel responses to all nonzero binary combinations of a given length. Decoding of the user data is performed according to a Viterbi algorithm, where the previously measured responses are used as expected samples for branch metric calculations. The measurement of the write-read channel responses and the decoding of the user data are fulfilled by a self-adjusting PRML receiver that contains a controllable clock recovery, a responses accumulator and an adjustable Viterbi detector. The controllable clock recovery produces a set of read-back signal samples containing exactly one sample per bit with or without phase error correction. The responses accumulator calculates averaged responses of the write-read channel. The adjustable Viterbi detector reconstructs the user data that were written to the disk.

17 Claims, 7 Drawing Sheets

0000010000110001010011110100011100100101101110110011010101011111

| i | Combination | i | Combination | i | Combination | i | Combination | i | Combination | i | Combination | i | Combination | i | Combination |
|---|---|---|---|---|---|---|---|---|---|---|---|---|---|---|---|
| 00 | 111110 | 08 | 001000 | 16 | 100010 | 24 | 011110 | 32 | 001110 | 40 | 001011 | 48 | 110110 | 56 | 101010 |
| 01 | 111100 | 09 | 010000 | 17 | 000101 | 25 | 111101 | 33 | 011100 | 41 | 010110 | 49 | 101100 | 57 | 010101 |
| 02 | 111000 | 10 | 100001 | 18 | 001010 | 26 | 111010 | 34 | 111001 | 42 | 101101 | 50 | 011001 | 58 | 101011 |
| 03 | 110000 | 11 | 000011 | 19 | 010100 | 27 | 110100 | 35 | 110010 | 43 | 011011 | 51 | 110011 | 59 | 010111 |
| 04 | 100000 | 12 | 000110 | 20 | 101001 | 28 | 101000 | 36 | 100100 | 44 | 110111 | 52 | 100110 | 60 | 101111 |
| 05 | 000001 | 13 | 001100 | 21 | 010011 | 29 | 010001 | 37 | 001001 | 45 | 101110 | 53 | 001101 | 61 | 011111 |
| 06 | 000010 | 14 | 011000 | 22 | 100111 | 30 | 100011 | 38 | 010010 | 46 | 011101 | 54 | 011010 | 62 | 111111 |
| 07 | 000100 | 15 | 110001 | 23 | 001111 | 31 | 000111 | 39 | 100101 | 47 | 111011 | 55 | 110101 | | |

| i | Combination | i | Combination | i | Combination | i | Combination |
|---|---|---|---|---|---|---|---|
| 00 | 111110 | 08 | 001000 | 16 | 100010 | 24 | 011110 |
| 01 | 111100 | 09 | 010000 | 17 | 000101 | 25 | 111101 |
| 02 | 111000 | 10 | 100001 | 18 | 001010 | 26 | 111010 |
| 03 | 110000 | 11 | 000011 | 19 | 010100 | 27 | 110100 |
| 04 | 100000 | 12 | 000110 | 20 | 101001 | 28 | 101000 |
| 05 | 000001 | 13 | 001100 | 21 | 010011 | 29 | 010001 |
| 06 | 000010 | 14 | 011000 | 22 | 100111 | 30 | 100011 |
| 07 | 000100 | 15 | 110001 | 23 | 001111 | 31 | 000111 |

| i | Combination | i | Combination | i | Combination | i | Combination |
|---|---|---|---|---|---|---|---|
| 32 | 001110 | 40 | 001011 | 48 | 110110 | 56 | 101010 |
| 33 | 011100 | 41 | 010110 | 49 | 101100 | 57 | 010101 |
| 34 | 111001 | 42 | 101101 | 50 | 011001 | 58 | 101011 |
| 35 | 110010 | 43 | 011011 | 51 | 110011 | 59 | 010111 |
| 36 | 100100 | 44 | 110111 | 52 | 100110 | 60 | 101111 |
| 37 | 001001 | 45 | 101110 | 53 | 001101 | 61 | 011111 |
| 38 | 010010 | 46 | 011101 | 54 | 011010 | 62 | 111111 |
| 39 | 100101 | 47 | 111011 | 55 | 110101 | | |

SELF-ADJUSTING PRML RECEIVER

FIELD OF THE INVENTION

The present invention relates generally to the detection of digital signals in channels with a large degree of linear and nonlinear distortions. More particularly, the invention relates to read-back signal processing in data storage systems, based on magnetic recording and Partial Response Maximum Likelihood (PRML) detection.

BACKGROUND

There is a constant demand for increase of data storage capacity in digital systems. This results in the continuous development of methods to increase bit density in magnetic recording systems. As bit density increases, data are packed more tightly on tracks, the distance between adjacent magnetization transitions diminishes and intersymbol interference, nonlinear distortions and noise, caused by interference from the neighboring tracks, increase. Partial Response Maximum Likelihood (PRML) detection has become an established and effective method of restoring read-back signals to the form of their original digital signals.

Figure 1:
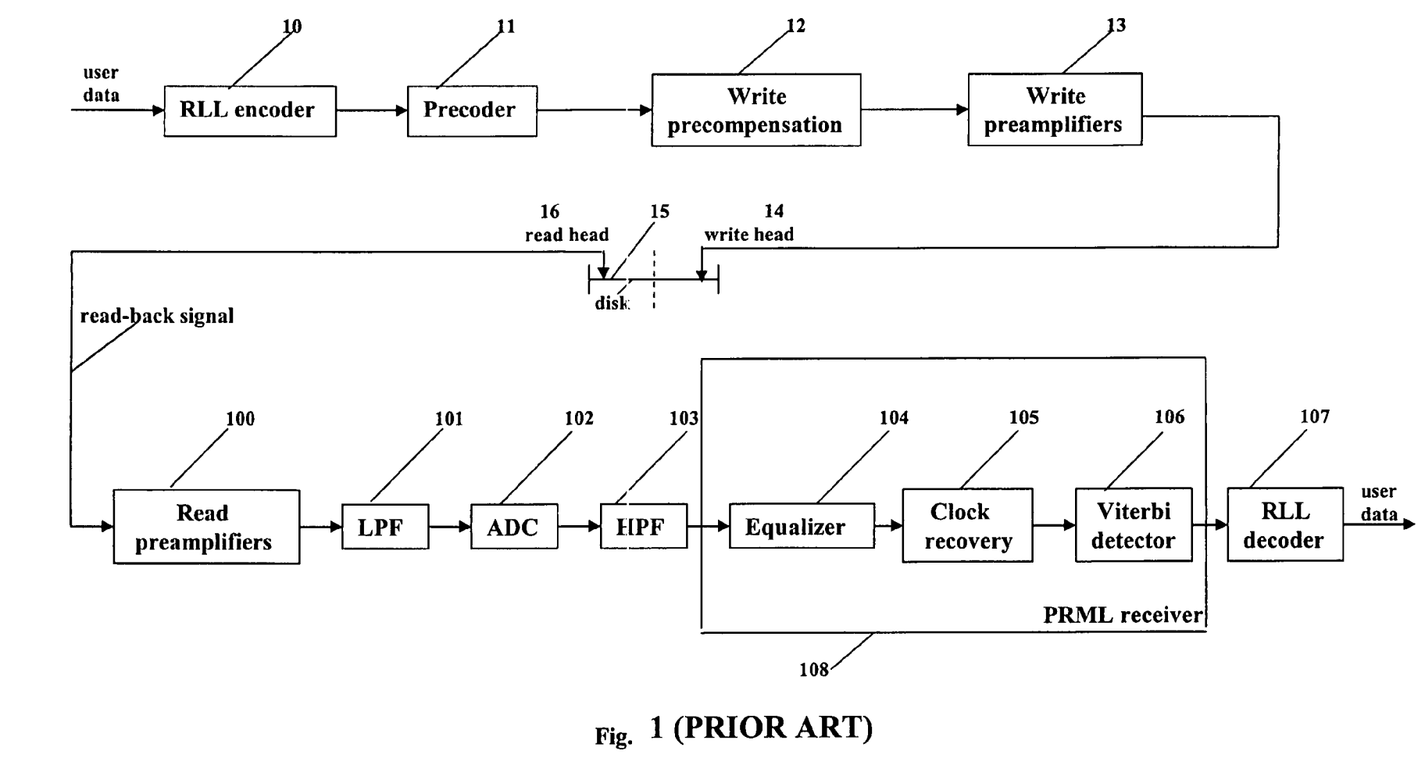
FIG. 1 is a block diagram of a prior art data storage write-read system, based on magnetic recording and the use of a PRML receiver.

A block diagram of a prior art data storage write-read system, based on magnetic recording and partial response maximum likelihood detection, is shown in FIG. 1.

With the device of FIG. 1., during a write operation, user data, containing a preamble in the beginning, are applied to the input of a storage device. A run length limited (RLL) encoder 10 performs a mapping of the unconstrained user data to a RLL constrained sequence, where the number of zeros between two successive ones is bounded from above as well as from below. A precoder 11 converts the received binary sequence into a new sequence in order to compensate for the transfer function of a write/read head assembly together with preamplifiers and equalizer. A write precompensation unit 12 modifies the exact timing of reversals of the write current depending on how far away the previous and upcoming transitions are with respect to each other. In that way, it provides a read-back pulse shape that best fits the particular decoding scheme being employed. The obtained sequence of binary bits is written to a magnetic disk media 15 through a write head 14.

During a read operation, the read head 16 reads back data from the magnetic disk 15. The read channel preamplifiers 100, that include gain control, raise the level of the read-back signals, making possible their subsequent processing. A low pass filter (LPF) 101 suppresses high frequency noise and cuts off the read-back signal spectrum, preventing aliasing during further analog to digital conversion in an analog-to-digital converter (ADC) 102. A high pass filter (HPF) 103 suppresses low frequency noise in the read-back signal, principally the interference from neighboring tracks. An equalizer 104 corrects the frequency response of the write/read channel and shapes the waveform of the read-back signal according to a desired form of the "target" response which is necessary for effective operation of Viterbi detector 106. Samples of read-back signal at the output of ADC 102 appear with a frequency that is higher than the frequency of data bits: during each time interval occupied by one bit more than one sample appears. A clock recovery circuit 105 restores samples of the read-back signal in correct time positions, with exactly one sample per data bit. For that purpose, the clock recovery 105, among other things, carries out the initial clock frequency and phase acquisition by processing the preamble, which forms a part of read-back signal. After processing the preamble, clock recovery 105 performs tracking of the relatively slow instabilities of the rotational speed of the disk 15. Tracking is a process of phase error correction, with phase errors being usually calculated from differences between input signal samples and expected sample values known a priori. Viterbi detector 106 determines the sequence of data bits that best matches the input sequence of the read-back signal samples in spite of signal corruption by noise, interference and different distortions. The assembly of the equalizer, clock recovery and Viterbi detector constitutes a PRML receiver. The features and inner structure of the PRML receiver specify to a large extent the qualitative characteristics of the storage system, and principally the bit error rate (BER). An RLL decoder 107 transforms the detected data obtained from the Viterbi detector 106 output into user data to be presented at the storage device output. In the absence of errors, the user data at the output of the data storage device during the read operation, are the same as the user data applied to the device input during the write operation.

Figure 2:
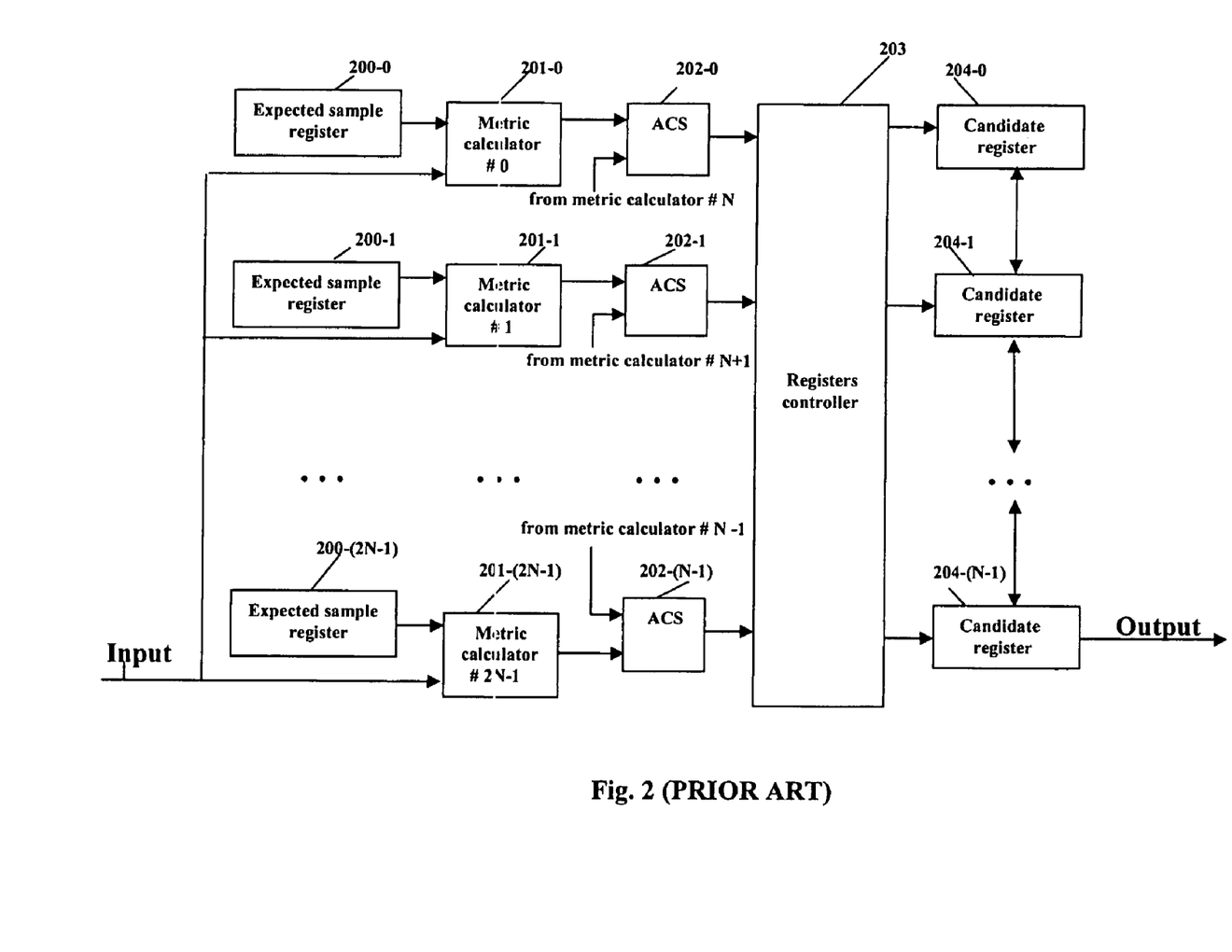
FIG. 2 is a block diagram of a prior art Viterbi detector.

A block-diagram of a prior art Viterbi detector is shown in FIG. 2. That Viterbi detector constitutes a state machine, and comprises, in general, N states. In each state, the next bit may be 0 or 1. The Viterbi detector includes a set of 2N metric calculators 201-1 . . . 201-(2N−1). Each metric calculator computes an Euclidean error metric as the squared difference between the actual signal sample at the Viterbi detector input and an expected sample that is kept in corresponding one of 2N expected sample registers 200-0 . . . 200-(2N−1). The expected sample corresponding to a particular branch of a state transition diagram for the Viterbi detector; is supposed to appear at the Viterbi detector input, if that particular branch is to "survive." When standard targets are used, then the expected samples for different branches often coincide. In such cases, corresponding expected sample registers and metric calculators may be united to simplify the apparatus. Sometimes, separate expected sample registers are not used, and instead, information about the expected sample is enclosed in the inner structure of an associated metric calculator. At each sample interval, computed metric is transferred from a metric calculator to a corresponding one of N add-compare-select units (ACS) 202-0 . . . 202-(N−1). Each ACS unit adds the new metric to the previously accumulated branch metric for each of its associated two branches. Then, the two accumulated branch metrics are compared, and the smaller is selected as the "surviving" branch metric for that state. The candidates for future bits of Viterbi detector output digital signal for each state are kept in candidate registers 204-0 . . . 204-(N−1). Each of the candidate registers has a bidirectional exchange input/output. The bidirectional exchange input/outputs of all candidate registers are united, providing the possibility of contents transfer between any two candidate registers. The outputs of the ACS units 202-0 . . . 202-(N−1) are connected to the inputs of registers controller 203. In response to the control signals applied to its inputs, the registers controller 203 shifts into each of the candidate registers 204-0 . . . 204-(N−1), the appropriate binary symbol corresponding to the selected branch (i.e., the branch that "survived"). Furthermore, the registers controller 203 merges the survivor candidate sequences, stored in candidates registers 204-0 . . . 204-(N−1), based on branches, that were eliminated. Eventually, all candidates are merged into one survivor sequence, so that all candidate registers contain the same bits at their respective outputs. The Viterbi detector output can be taken from the output of any one of the candidate registers. In FIG. 2 the output is taken from the last candidate register 204-(N−1).

The use of a PRML receiver of the conventional form solves most of the problem of linear intersymbol interference. However, there are several causes of high density recording performance quality degradation, that remain not resolved by prior art PRML receivers.

The equalizer 104 that is an obligatory part of the conventional PRML receiver, generally has a transfer function with a "boost" in the high frequency region. Since the noise level typically exceeds the read-back signal components at high frequencies, this boost causes a reduction in signal to noise ratio with a corresponding deterioration of the bit error rate (BER). Generally, an optimization procedure based on a least-mean-square algorithm, is used in the PRML receivers with the objective of finding a compromise between the noise level increase and residual signal distortions (see, for example, U.S. Pat. No. 5,995,544 "Adaptive equalization for PR IV transmission systems"). A somewhat different approach, with the goal to adjust the Viterbi detector threshold levels during the optimization procedure, is disclosed in U.S. Pat. No. 5,341,387 "Viterbi detector having adjustable detection thresholds for PRML class IV sampling data detection," U.S. Pat. No. 5,440,433 "Circuit and method for adjusting a data detecting level of a disk driving apparatus," U.S. Pat. No. 5,610,776 "Method of optimizing read channel of disk drive recording apparatus by using error rate," and U.S. Pat. No. 5,954,837 "Method for optimizing Viterbi detector thresholds values." An attempt to alleviate the equalizer optimization procedure by using more complicated response polynomial, is disclosed in U.S. Pat. No. 6,249,398 "Class of partial response targets in a PRML sampled data detection channel." In U.S. Pat. No. 6,600,617 "Method and apparatus for adjusting digital filter taps based upon minimization of Viterbi margin counts," the use of a Viterbi detector margin for equalizer optimization is disclosed. In spite of so numerous and various efforts, the problem cannot be considered to be settled conclusively. In the prior art, a significant part of the BER in magnetic recording storage systems is due to the presence of the equalizer in a PRML receiver.

As storage systems are developed with increased magnetic recording density, magnetiorestrictive (MR) heads are often used, leading to a sharp rise of nonlinear distortions in the read-back signal. When the distance between adjacent transitions on magnetic media decreases, a transition, that immediately follows a preceding transition, is subjected to magnetic interference from the preceding transition and is shifted toward that preceding transition. The distance between transitions becomes different from the ideal: the so-called nonlinear transition shift (NLTS) appears. Additional nonlinear distortions appear because of hysteresis in the magnetic material and hard transition shift. Correction of nonlinear distortions by refinements in the inner structure of Viterbi detector was suggested in U.S. Pat. No. 5,889,823 "Method and apparatus for compensation of linear or nonlinear intersymbol interference and noise correlation in magnetic recording channels," and U.S. Pat. No. 6,393,598 "Branch metric compensation for digital sequence detection." Write precompensation as a method to reduce the number of error caused by NLTS, was disclosed in U.S. Pat. No. 5,493,454 and U.S. Pat. No. 5,583,705 with the same title "Write precompensation optimization in a PRML channel using a selected PRML signal level." Methods of nonlinearity correction and/or compensation, that are known today, are very useful and were crucial in enhancement of magnetic recording density. However even after they are applied, substantial nonlinear distortions remain in the read-back signal with corresponding detrimental effects.

A significant change in the conventional Viterbi detector was proposed in U.S. Pat. No. 5,588,011 "Tuned Viterbi detector and equalizer system". It was suggested to compute branch metrics as squared differences between an input sample and a reference sample, with the reference sample being found as a result of averaging input samples related to a certain binary combination in the Viterbi detector output digital signal. Since such implementation eliminates the necessity of any assumptions about superposition of responses in the read-back signal, the Viterbi detector of this type becomes much more resistant to any nonlinear distortions. Unfortunately, the use of Viterbi detector output digital signal, while determining reference samples, and the absence of appropriate changes in clock recovery circuit, that would provide for phase correction with arbitrary pulse response shapes, make it compulsory to include an equalizer in the resultant PRML receiver, as it was before. An additional drawback of this prior art implementation of a Viterbi detector, is the compulsory coincidence between state length and the distance at which nonlinear distortions are corrected in a PR IV detector, for example, the state length is two bits, whereas nonlinear intersymbol interference may spread over 3, 4 and more bits, so that nonlinear distortions in the prior art PRML receiver, cannot be cleared out completely as a matter of principle.

Thus, a method and apparatus for PRML receiver implementation, that make possible its operation without read-back signal equalization and which prevents error occurrence due to nonlinear distortions with any nonlinear interference distance, would be an important improvement in the art.

SUMMARY OF INVENTION

According to an aspect of this invention, a partial response maximum likelihood (PRML) data detecting in a magnetic recording storage device is carried out with a preliminary measuring of write-read channel responses to all nonzero binary combinations of a given length. The following write-read operations include decoding of user data according to a Viterbi algorithm with the use of previously measured responses as expected samples for branch metric calculations.

According to another aspect of this invention, a clock frequency and an initial clock phase are acquired by processing one or more preambles of the read-back signal. In the training mode, when the write-read channel responses are measured, the clock signal is generated without clock phase correction in the intervals between adjacent preambles. In the detecting mode, when the user data are decoded, the clock phase is corrected, based on the phase error signal that produced as a by-product of the execution of the Viterbi algorithm. The generated clock signal is used to build a set of read-back signal samples, this set containing exactly one sample per bit.

According to yet another aspect of this invention, a hypothetical phase error for each Viterbi algorithm branch is computed as a deviation of an read-back signal sample from an expected sample, multiplied by a derivative of the read-back signal. Strings of the hypothetical phase errors are formed, advanced and merged according to add-compare-select operations in the Viterbi algorithm. The survived hypothetical phase error is used as phase error signal for the clock phase correction.

According to yet another aspect of this invention, the measurement of the write-read channel responses and the decoding of the user data are fulfilled by a self-adjusting PRML receiver that contains a controllable clock recovery, a responses accumulator and an adjustable Viterbi detector. The controllable clock recovery produces a set of read-back signal samples containing exactly one sample per bit with or without phase error correction. The responses accumulator generates averaged responses of the write-read channel to all possible binary combinations of a given length. The adjustable Viterbi detector reconstructs the user data that were written to the disk.

According to yet another aspect of this invention, the adjustable Viterbi detector includes means for input signal preliminary processing, calculating means and memory means. The means for input signal preliminary processing are composed of expected sample registers for storing the write-read channel responses, a demultiplexer for distribution of the responses between the expected sample registers, a differentiator for creating a derivative of the input signal of the adjustable Viterbi detector and a delay line for delaying the input samples. The calculating means are composed of the metric calculators, the multipliers and the add-compare-select units. The metric calculators compute the differences between delayed input sample and expected samples along with squares of these differences forming metrics of decoder branches. The multipliers produce the hypothetical phase errors by multiplying the output signal of the differentiator by the difference found in the corresponding metric calculator. The add-compare-select units carry out the similar part of the Viterbi algorithm. The memory means are composed of the candidate registers, the phase error registers and a registers controller. The candidate registers store the strings of bits that may be put at the data output of the adjustable Viterbi detector in case the associated state survives. The phase error registers store the strings of hypothetical phase errors that may be put at the phase error output of the adjustable Viterbi detector in case the associated state survives. The registers controller receives the information about selected and eliminated branches from the add-compare-select units and controls the operation of the candidate registers and the phase errors registers in accordance with this information.

According to yet another aspect of this invention, to compensate the nonlinear distortions in the read-back signal on a time interval that exceeds the Viterbi detector state length a set of expected samples memories are used in the adjustable Viterbi detector. Each expected samples memory stores several of the write-read channel responses to binary combinations that have a common string of bits in the end. The signal input of each of the expected samples memories is connected to the correspondent output of the demultiplexer. The address input is connected to the bidirectional exchange input/output of associated candidate register. The output of the expected samples memory is connected to the primary input of the associated metric calculator.

DETAILED DESCRIPTION OF THE PREFERRED EMBODIMENTS

A self-adjusting PRML receiver according to the present invention can operate in one of two modes: a training mode or a detection mode. In the training mode, the self-adjusting PRML receiver reads a special test pattern that was written to a magnetic disk beforehand. The test pattern contains a number of preambles that are evenly distributed along the pattern length. Between the preambles, a special sequence of bits is repeated periodically. This special sequence comprises all possible nonzero binary combinations of a given length L; the position in the sequence where a certain combination appears, is known in advance. The self-adjusting PRML receiver carries out the operation of clock recovery by building a set of read-back signal samples in correct timing positions with exactly one sample per each test pattern bit. Preambles that occur often enough, enable the self-adjusting PRML receiver to maintain the correct phase of the samples despite possible disk rotation speed fluctuations and the impossibility of usual phase correction due to the absence of any knowledge about the write/read channel properties at this stage. Then the self-adjusting PRML receiver uses the test pattern structure between the preambles, to measure responses of the write/read channel to all possible binary combinations of a given length L. The measured values are averaged over repeated pattern parts, eliminating effect of random noise. The training mode ends by saving the averaged responses. During the detection mode, the self-adjusting PRML receiver reconstructs the digital signal that was previously written to the disk, using a standard Viterbi algorithm. The metric for every branch of the algorithm is calculated as a square of the difference between the next input sample and the expected sample, the averaged response to the corresponding binary combination measured in the training mode being used as the expected sample. The same difference is used as a base for phase error signal calculation with following clock phase correction.

Figure 3A:
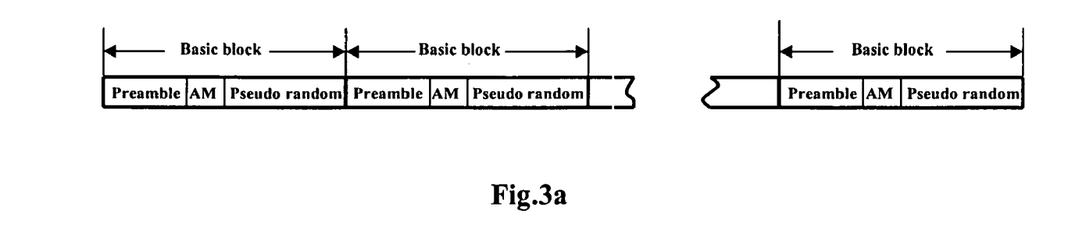
FIG. 3a illustrates the structure of a possible test pattern for use with the present invention.
Figure 3B:
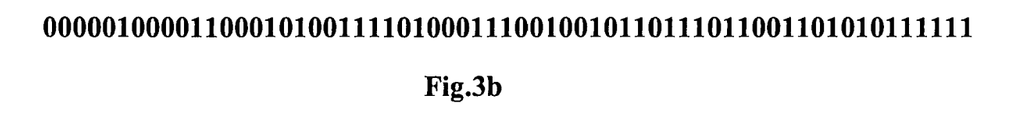
FIG. 3b illustrates an exemplary pseudorandom sequence for use in the structure at FIG. 3a, and FIG. 3c illustrates the correspondence between the number i of a position in the sequence of FIG. 3b and the combination that ends into that position.
Figure 3C:
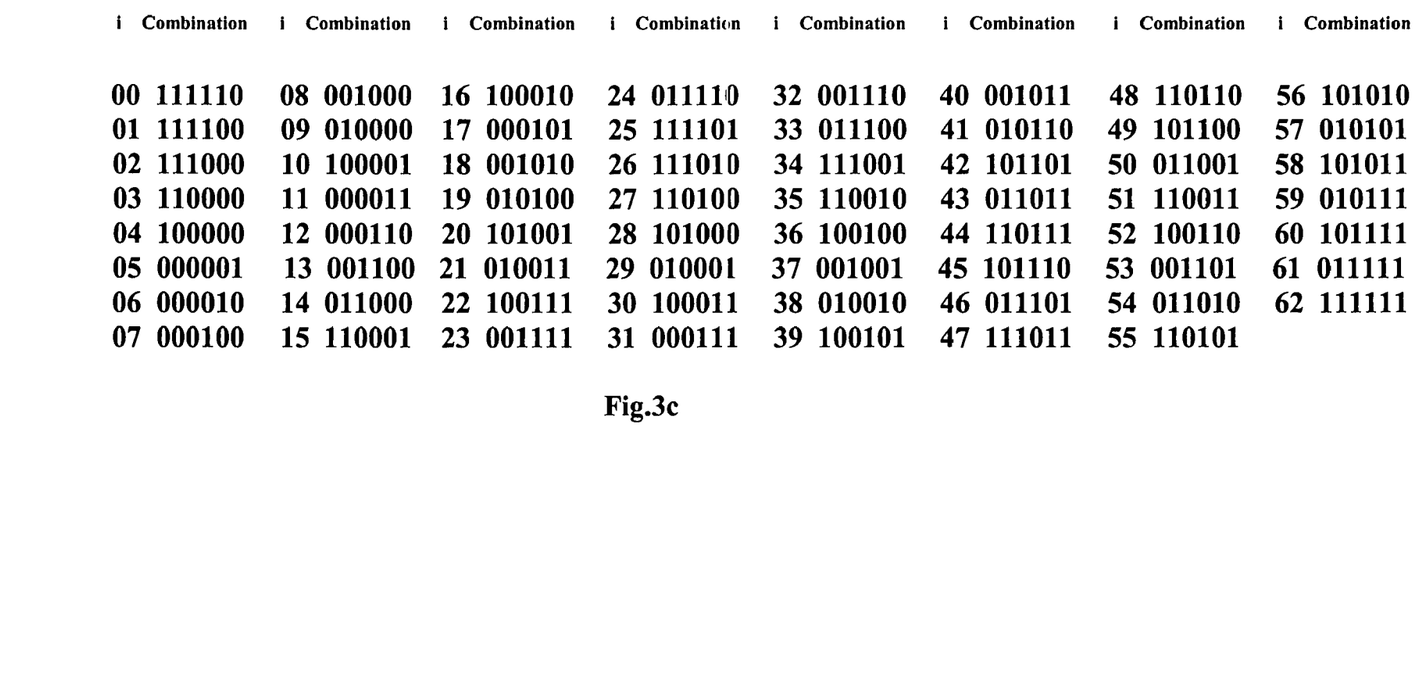

The general structure of one possible test pattern is shown in FIG. 3a. This test pattern is generated as a periodical repetition of basic blocks. Each basic block has at its beginning, a preamble that is followed by an address mark. After the address mark and up to the end of the basic block, the test pattern consists of periodically repeated pseudorandom sequences with a given inherent length of a binary combination L. As an example, a pseudorandom sequence with L=6 is shown in FIG. 3b. A pseudorandom sequence contains all nonzero binary combinations of the length L and each of these combinations only once, so that it is possible to establish a one-to-one correspondence between a number of a position in the pseudorandom sequence and the binary combination which ends in that position. Again as an example, the table in FIG. 3c shows the correspondence between number i of a position in the pseudorandom sequence for L=6 and the combination that ends in that position.

Figure 4:
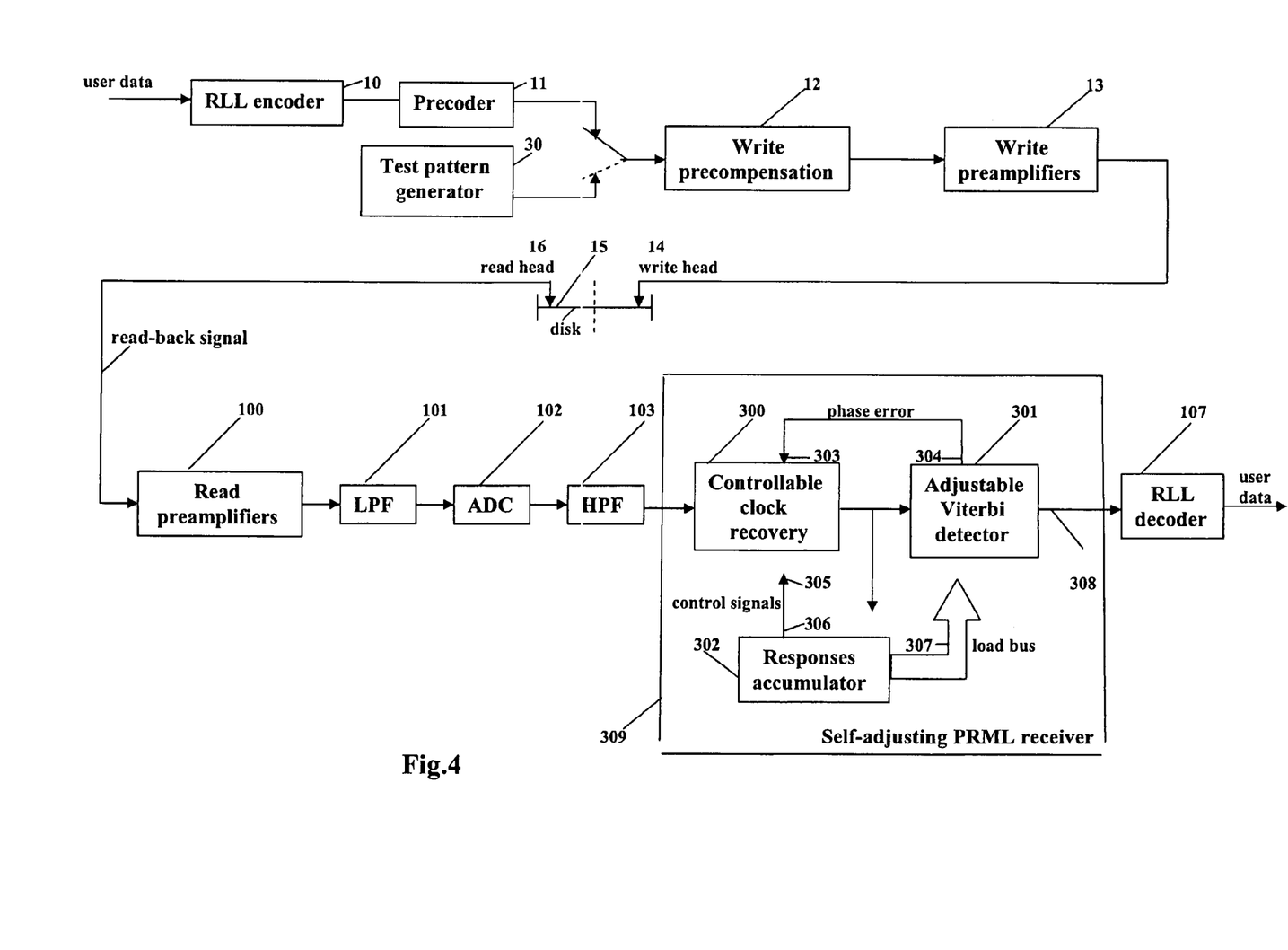
FIG. 4 is a block diagram of data storage write-read system based on magnetic recording, that uses self-adjusting PRML receiver according to the present invention.

FIG. 4 shows a block diagram the of a data storage write-read system (based on magnetic recording) with an exemplary self-adjusting PRML receiver according to the present invention. In the training mode, a pattern generator 30 generates a test pattern with the structure that was described above. This test pattern is transmitted to a write precompensation unit 12. In the detection mode, user data encoded in an RLL encoder 10 are applied through precoder 11 to the input of the write precompensation unit 12. In the illustrated embodiment, a switch SW that precedes the write precompensation unit 12, selects the operative mode of the self-adjusting PRML receiver. The output signal of the write precompensation unit 12 is passed to write preamplifiers unit 13, that feeds the amplified signal to a write head 14 for writing to a magnetic disk 15. A read head 16 is adapted to read signals from the disk 15. The read signals are passed through read pre-amplifiers 10, low pass filter 101, analog-to-digital converter (ADC) 102 and high pass filter 103 to the self-adjusting PRML receiver 309. The self-adjusting PRML receiver 309 includes a controllable clock recovery unit 300, a responses accumulator 302 and an adjustable Viterbi decoder 301. The output of the adjustable Viterbi detector 301 is applied to an RLL decoder 107 to provide the output for the system of FIG. 4. While writing data to the disk, the RLL encoder 10, the precoder 11, the write precompensation unit 12, the write preamplifiers 13 and the writing head 14 operate in the "conventional" fashion. Likewise, during a read operation, the read head 16, the read preamplifiers 100, the low pass filter LPF 101, the analog to digital converter (ADC) 102, the high pass filter HPF 103 and the RLL decoder 107 operate in the same manner as in the conventional magnetic storage device shown in FIG. 1.

The controllable clock recovery 300 is similar to the clock recovery unit 105 of FIG. 1, but with a difference: while carrying out clock phase correction, it does not calculate the phase error, but uses a phase error value applied to its phase error input 303. Furthermore, in response to the signals arriving at its control input 305, the controllable clock recovery 300 may switch the clock phase correction process on or off, and begin preamble processing anew. For any bit of a pattern that was written to the disk 15, exactly one sample appears at the output of the controllable clock recovery 300. Because of linear and nonlinear intersymbol interference, this sample depends not only on the value of one bit, but on a group of preceding bits as well. Therefore, each sample at the output of the controllable clock recovery 300 is a response of a write/read channel to a certain binary combination. In the training mode, samples from the output of the controllable clock recovery 300 are applied to the input of the responses accumulator 302. The responses accumulator 302 processes these incoming samples to obtain an averaged response of the write/read channel to every possible binary combination of a given length L. Simultaneously, it controls the operation of the controllable clock recovery 300 through the control signals output 306. At the end of the training mode, the responses accumulator 302 loads the obtained averaged responses to the adjustable Viterbi detector 301 (as expected samples values) through a load bus 307. In the detection mode, samples from the controllable clock recovery 300 output are applied to the input of the adjustable Viterbi detector 301. The adjustable Viterbi detector 301 reconstructs the data that were written to the disk. The averaged responses that were loaded into the adjustable Viterbi detector 301 through the load bus 307 at the end of the training mode are used in this process as the expected samples for metric calculation. At the same time, the adjustable Viterbi detector 301 generates a "current phase error" signal on its phase error output 304. This signal is applied to the phase error input 303 of the controllable clock recovery 300.

In the training mode, the controllable clock recovery 300 processes every preamble of the test pattern. By doing so, it finds the new values of the clock frequency and the clock phase and then restores the samples of the read-back signal, in the correct time positions, one sample per bit. Since the preambles in the test pattern are repeated often enough, accurate read-back signal samples restoration in correct time moments is effected without additional clock phase correction.

Internally, the responses accumulator 302 contains an address mark detector, a responses memory, a combinations read-only memory (ROM) and a set of counters. The address mark detector is constructed in such a way as to enable finding an address mark directly in the sequence of samples that appear at the output of the controllable clock recovery 300. The responses memory keeps the current cumulative responses of the read-write channel. The combinations ROM stores a table (similar to one shown in FIG. 3c), that enables finding for any number i, the binary combination which ends in the position i in the pseudorandom sequence being used. The set of counters includes a position counter (that counts the positions inside each pseudorandom sequence), a sequence counter (that counts the pseudorandom sequences inside each basic block), and a block counter (that counts the basic blocks in the test pattern.).

Figure 5:
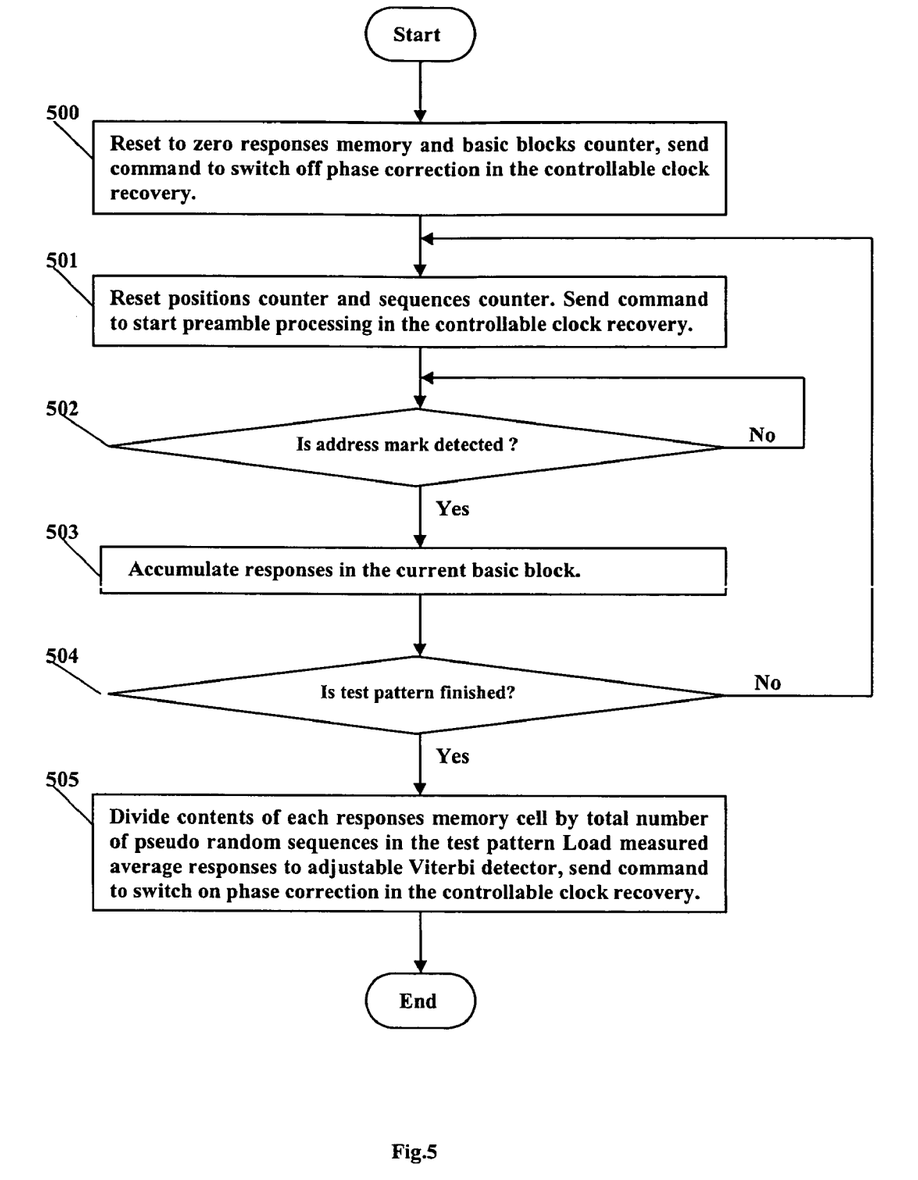
FIG. 5 is a flowchart, illustrating responses accumulator operation.

A flow chart shown in the FIG. 5 illustrates the operation of the responses accumulator 302. When the training mode starts, the responses accumulator 302 writes zeros to all cells of the responses memory and resets all three inner counters. At the same time it sends through the control signals output 306, an instruction to the controllable clock recovery 300 to switch off the clock phase correction process and to begin the preamble processing.

When the next basic block is processed, the same steps are repeated again and again. At first, the responses accumulator 302 waits for the address mark to appear in the input signal. After the address mark detector finds the address mark, the responses accumulator 302 reads at each next timing interval, the number of the current position in the pseudorandom sequence from the position counter. Then it identifies from combinations ROM, the binary combination that ends in this position. The identified binary combination is used as an address to access the responses memory. The current input sample is added to the contents of the accessed cell of the responses memory. The received sum is then saved in the same cell.

The sequence counter counts the passing pseudorandom sequences. When the number of pseudorandom sequences that have passed reaches the known total number of the pseudorandom sequences in a basic block, the responses accumulator 302 interrupts the accumulations of the responses and checks the contents of the block counter. If the number of passed basic blocks is less than the total number of blocks in the test pattern, then the responses accumulator 302 returns to the beginning of its operation loop. Otherwise, the responses accumulator 302 divides the content of each responses memory cell by the total number of pseudorandom sequences in the test pattern. At that moment, each responses memory cell contains the averaged response of the write/read channel to the binary combination that equals the cell's address. After reaching this point, the responses accumulator 302 loads the calculated average responses to the adjustable Viterbi detector 301 through the load bus 307. Then it sends through the control signal output 306, an instruction to the controllable clock recovery 300 to switch on the clock phase correction process. In that way the responses accumulator ends the training mode.

Figure 6:
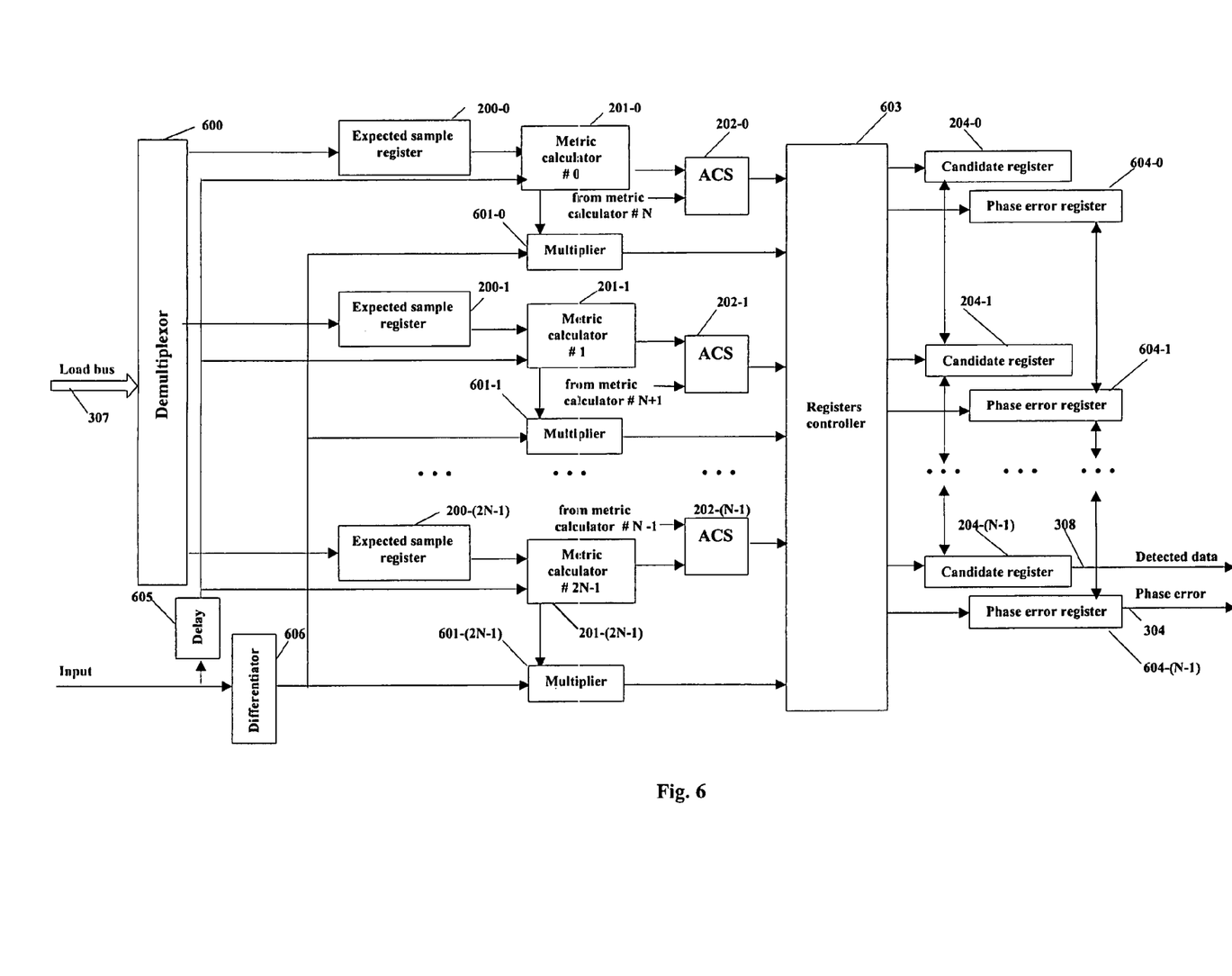
FIG. 6 is a block diagram of an adjustable Viterbi detector according to the present invention.

A block diagram of one exemplary embodiment of the adjustable Viterbi detector is shown in FIG. 6. There are several differences between this block diagram and the block diagram of a conventional Viterbi detector in FIG. 2. First, the contents of the expected samples registers 200-0 . . . 200-(2N−1) are not fixed: the expected samples values are loaded into the expected samples registers 200-0 . . . 200-(2N−1) through the load bus 307 and the demultiplexer 600. Next, the phase error calculation requires the use of the input signal derivative; to calculate the derivative a differentiator 606 is used. To illustrate the operation of the adjustable Viterbi detector, the input samples are referred to as x[k], where k is the number of the current timing interval. The differentiator 606 calculates the derivative sample d[k] according to the procedure:

if $x[k]-x[k-1]>0$ and $x[k-1]-x[k-2]>0$, then $d[k]=1$, else if $x[k]-x[k-1]<0$ and $x[k-1]-x[k-2]<0$, then $d[k]=-1$, else $d[k]=0$.

That calculation procedure creates the derivative d[k] with a delay of one timing interval in relation to the input signal. To restore the synchronism, the delay line 605 is used to detain the input signal for the same timing interval.

Each of the metric calculators 201-0 . . . 201-(2N−1) has a primary input and a secondary input. The primary input is connected to the output of the associated expected sample register. The secondary input of the metric calculator is connected to the output of the delay line 605. At each timing interval, the metric calculator 201-$i$, $0 \subseteq i \subseteq 2N-1$, calculates the branch i deviation. This deviation is calculated as the difference between the delayed input sample and the expected sample that is stored in the expected sample register 200-$i$. The metric for a branch with a number i, is determined as a square of the branch i deviation. The calculated metric is placed on the metric calculator 201-$i$ primary output, which is coupled with an input of its associated ACS unit. Simultaneously, the deviation of the branch i is applied to the secondary output of the metric calculator 201-$i$. That secondary output is connected to one of the inputs of the adjacent multiplier 601-$i$. In the multiplier 601-$i$, a product of the branch i deviation and input signal derivative is determined and placed at the output. This product provides a hypothetical phase error for the branch i. The hypothetical phase error for the branch i, is applied to the adjustable Viterbi detector phase error output 304, if the branch i finally survives.

Each ACS unit 202-$i$, $0 \subseteq i \subseteq N-1$, receives calculated metrics from the respective metric calculators 201-$i$, 201-(i+N). The new metric is added to the previously accumulated branch metric for each of the two branches with numbers i and i+N. Then the two accumulated branch metrics are compared, and the smaller is selected as the surviving branch metric for state i.

The candidate register 204-$i$, $0 \subseteq i \subseteq N-1$, keeps a string of hypothetical future detected bits that corresponds to a state with a number i. Similarly, each phase error register 604-$i$, $0 \subseteq i \subseteq N-1$, keeps a string of hypothetical phase errors that corresponds to a state with a number i. Each of the candidate registers has a bidirectional exchange input/output. The bidirectional exchange input/outputs of all candidate registers are united, providing the possibility of content transfer between any two candidate registers. A similar technique is used to provide the necessary connection between the phase error registers. All registers are controlled by the registers controller 603. The registers controller 603 receives branch select control signals from ACS units 202-0 . . . 202-(N−1). In response to received signals the registers controller 603 shifts the associated binary symbol and associated hypothetical phase error into the corresponding candidate register 204-$i$ and the phase error register 604-$i$, $0 \subseteq i \subseteq N-1$ respectively. Further, the registers controller 603 merges the candidate sequences and hypothetical phase errors sequences stored in the candidate registers and the phase error registers, based on branches which were eliminated. Eventually, all sequences merge into a candidate survivor sequence and into a phase error survivor sequence, so that all the candidate registers and the phase error registers have the same content at their respective outputs. The Viterbi detector outputs can be taken from the output of any one of the candidate registers and from the output of any one of the phase error registers. In FIG. 6, the phase error output 304 is taken from the output of the last phase error register 604-(N−1), whereas the output of the last candidate register 204-(N−1) is used as detected data output 308.

In the embodiment of the PRML receiver according to the present invention that was described above, there is no equalizer and an assumption of read channel linearity is not used in any form. As a consequence, bit error rate reduction is achieved, compared to prior art system.

In the block diagram of FIG. 6, the length of the time interval, where the nonlinear interference of preceding bits is taken into account, cannot exceed the Viterbi detector state length. At the same time the nonlinear interference in the real read-write channels may spread over an interval that is bigger than the Viterbi detector state length. Impossibility of a complete nonlinear interference correction may hinder the efforts of the further diminution of the error rate.

Figure 7:
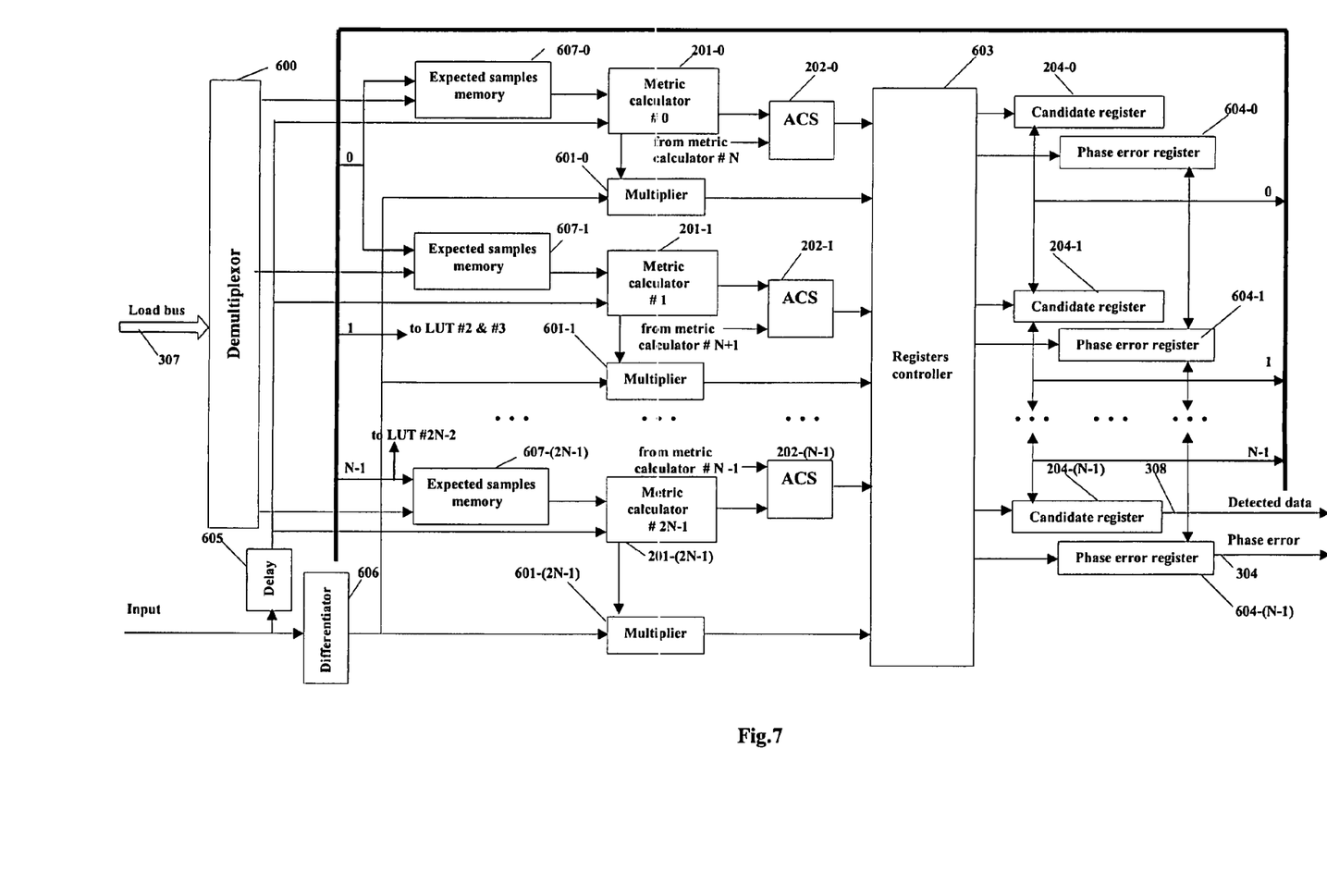
FIG. 7 is a block diagram of another embodiment of an adjustable Viterbi detector according to the present invention.

FIG. 7 shows a block diagram of another embodiment of adjustable Viterbi detector according to present invention. This embodiment provides for a compensation of the nonlinear distortions on a time interval that is independent of the Viterbi detector state length. Here, the expected sample registers are replaced by the expected samples memories 607-0 . . . 607-(2N−1). If the state length is n bits and nonlinear distortions are to is be compensated on a time interval with the length of L bits, then the number of samples that are kept in each expected samples memory 607-$i$, $0 \subseteq i \subseteq N-1$, equals 2 to the power (L-n−1). Each of the expected samples memories has a signal input, an address input and an output. The signal input of the expected samples memory is connected to the correspondent output of the demultiplexor 600. The address input is connected to the bidirectional exchange input/output of associated candidate register. The output of the expected samples memory is connected to the primary input of the associated metric calculator. The expected samples are loaded to the expected samples memories 607-0 . . . 607-(2N−1) at the end of the training mode through the load bus 307 and the demultiplexer 600. The demultiplexer 600 directs averaged response to a binary combination b[L-1], b[L-2], . . . , b[1], b[0] into the expected samples memory, that corresponds to a state b[n], b[n−1], . . . , b[2], b[1] and a hypothetical next bit b[0]. In the expected samples memory the binary combination is placed in a cell with an address b[L-1], b[L-2], . . . , b[n+2], b[n+1]. In the detection mode, L-n−1 first bits from the candidate register 204-*i* are transferred as one piece in a parallel code to the address inputs of the expected samples memories 607-2*i* and 607-(2*i*+1). In that way, an expected sample is chosen in each expected samples memory. That sample is passed to the associated metric calculator, where it is used as base for further calculations. The rest of the system of FIG. 7 operates as in FIG. 6.

A number of implementations of the present invention have been described. Nevertheless, it will be understood that various modifications may be made. Accordingly, other implementations are within the scope of the following claims.

What is claimed is:

1. A method for partial response maximum likelihood (PRML) data detecting in a magnetic recording storage device, said method comprising the steps of: (a) measuring write-read channel responses of said storage device to all nonzero binary combinations of a given length; (b) decoding applied user data according to a Viterbi algorithm using said previously measured responses as expected samples for branch metric calculations in said algorithm; wherein said responses measuring step comprises the sub-steps of: (a) writing to a magnetic data recording disk a test pattern representing reiteration of a basic blocks, each block including a preamble, an address mark and periodically repeated pseudo-random seciuences containing all nonzero binary combinations of a given length; (b) reading the test pattern from the disk to generate a read-back test signal; (c) processing the read-back test signal to generate write-read channel responses to all nonzero binary combinations of the given length; wherein said read-back test signal processing comprises the sub-steps of: (a) acquiring clock frequency and initial clock phase during each preamble in the read-back test signal without clock phase correction up to next preamble appearance; (b) using said acquired clock frequency and clock phase to build a set of read-back test signal samples, said set containing exactly one sample per test pattern bit; (c) separating out said samples as responses to different binary combinations in the pseudo-random part of each of said basic blocks, and averaging samples corresponding to the same binary combination over the entire test pattern.

2. A method of data detecting according to claim 1 wherein said user data decoding comprises the sub-steps of: (a) reading user data, written previously to a magnetic data recording rotating disk, to generate a read-back signal, said user data including a preamble, an address mark, and a pattern; (b) processing the preamble of said read-back signal to acquire a clock frequency and an initial clock phase, and tracking slow instabilities of the disk rotational speed by correcting the clock phase using the phase error signal; (c) building a set of read-back signal samples with the use of acquired clock frequency and clock phase, said set containing exactly one sample per test pattern bit; (d) decoding user data according to a Viterbi algorithm with the use of the previously measured write-read channel responses as expected samples for the branches metrics calculation; (d) producing the phase error signal to be used in the sub-step (b).

3. A method of data detecting according to claim 2 wherein said phase error signal producing comprises the steps of: (a) computing a hypothetical phase error for each Viterbi algorithm branch as a deviation of an input signal sample from an expected sample, multiplied by a derivative of said read-back signal; (b) generating a phase error signal using results of an add-compare-select operation in said Viterbi algorithm to form, advance and merge strings of said hypothetical phase errors.

4. A self-adjusting PRML receiver comprising: (a) a controllable clock recovery for vroducing a set of read-back signal samples containing exactly one sample per bit with or without phase error correction, said controllable clock recovery having a read-back signal input to be used as the self-adjusting PRML receiver input, a phase error signal input, a control input and an output; (b) a responses accumulator for producing averaged responses of the write-read channel to all possible binary combinations of a given length, said responses accumulator having an input, a control output and a responses load bus output with said input being connected to said controllable clock recovery output and said control output being connected to said controllable clock recovery control input; (c) an adjustable Viterbi detector for reconstruction of user data, having a signal input connected to controllable clock recovery output, a responses load bus input connected to responses accumulator responses load bus output, a phase error output connected to controllable clock recovery phase error signal input and a detected data output forming a self-adjusting PRML receiver output; wherein said controllable clock recovery is configured to: receive the instructions through the control input; switch the clock chase correction on and off in response to the corresponding instruction; begin the preamble processing anew in response to the corresponding instruction; wherein said responses accumulator is configured to: receive a read-back signal that is produced as a result of reading a magnetic recording of a test pattern of a specific structure; separate samples of the received read-back signal that constitute responses to different binary combination of the test pattern; average responses to the same binary combination over the whole test pattern; load the averaged responses through the responses load bus output after detecting the end of the test pattern; determine the turning points in the processed read-back signal and to produce accordingly the control instructions for switching the clock phase correction on/off and for beginning the preamble processing anew.

5. A self-adjusting PRML receiver of the claim 4, wherein said adjustable Viterbi detector is configured to; receive the averaged responses through the responses load bus input; establish a one-to-one correspondence between the received averaged responses and the states of the Viterbi detector; calculate state metrics using the corresponding averaged response as the expected sample value.

6. A self-adjusting PRML receiver of the claim 4, wherein said adjustable Viterbi detector includes means for input signal preliminary processing, said means comprising: (a) a demultiplexer for distribution of the said write-read channel responses, said demultiplexer having an input and a set of outputs with said input forming a responses load bus input of the adjustable Viterbi detector; (b) expected sample registers for storing said write-read channel responses, each expected sample register having an input and an output with said input connected to the corresponding output of said demultiplexer; (c) a differentiator for creating a derivative of said adjustable Viterbi detector input signal, said differentiator having an input providing a signal input of said adjustable Viterbi detector, and an output for providing said derivative; (d) a delay line for creating delayed input samples, said delay line having an input connected to said signal input of the adjustable Viterbi detector, and an output for providing said delayed input samples.

7. A self-adjusting PRML receiver of the claim 6, wherein said differentiator is configured to produce the derivative d[k] of the adjustable Viterbi detector input signal x[k] according to the rule; if x[k]−x[k−1]>0 and x[k−1]−x[k−2]>0, then d[k]=1, else if x[k]−x[k−1]<0 and x[k−1]−x[k−2]<0, then d[k]=−1, else d[k]=0. the k being the number of the current sampling interval.

8. A self-adjusting PRML receiver of the claim 6, wherein said means for input signal preliminary processing of the said adjustable Viterbi detector comprise a set of expected samples memories for storing said write-read channel responses, each of the said expected samples memories having a signal input, an address input and an output, with the signal input connected to the corresponding output of said demultiplexor, the address input connected to the bidirectional exchange input/output of associated candidate register and the output connected to the primary input of the associated metric calculator.

9. A self-adjusting PRML receiver of the claim 8, wherein said demultiplexor is configured to direct the averaged response to a binary combination b[L−1], b[L−2], . . . , b [1], b[0] into the expected samples memory that corresponds to a state b[n], b[n−1], . . . , b[2], b[1] and a hypothetical next bit b[0].

10. A self-adjusting PRML receiver of the claim 8, wherein said expected samples memories are configured to store the averaged response to a binary combination b[L−1], b[L−2], . . . , b[1], b[0] in the memory cell with an address b[L−1], b[L−2], . . . , b[n+2], b[n+1].

11. A self-adjusting PRML receiver of the claim 4, wherein said adjustable Viterbi detector includes calculating means, said means comprising: (a) metric calculators for calculating the differences between delayed input sample and expected samples along with squares of said differences to form the metrics of decoder branches, each of said metric calculators having a primary input connected to an output of an associated expected sample register, a secondary input, connected to an output of the delay line, an primary output, for providing said metric, and a secondary output for providing said difference; (b) multipliers for calculating a hypothetical phase errors, each of said multipliers having a first input connected to a output of the differentiator, the second input connected to a secondary output of an associated metric calculator and an output for providing the calculated hypothetical phase error; (c) add-compare-select units for carrying out the corresponding part of the Viterbi algorithm, each of the add-compare-select units having an input connected to an associated metric calculator output and an output for providing the calculations result.

12. A self-adjusting PRML receiver of the claim 4, wherein said adjustable Viterbi detector includes memory means, said means comprising: (a) candidate registers for storing strings of bits that may be put at the adjustable Viterbi detector detected data output in case an associated state survives, each of said candidate registers having an input, a bidirectional exchange input|output connected to similar input/outputs of other candidate registers and an output, with the output of one of candidate registers being used as adjustable Viterbi detector detected data output; (b) phase error registers for storing strings of hypothetical phase errors that may be put at the adjustable Viterbi detector phase error output in case the associated state survives, each of said phase error registers having an input, a bidirectional exchange input/output connected to similar input/outputs of other phase error registers and an output, with the output of one of phase error registers being used as adjustable Viterbi detector phase error output; (c) a registers controller for receiving information about selected and eliminated branches from add-compare-select units and for controlling the operation of the candidate registers and the phase errors registers, said registers controller having a set of inputs connected to the outputs of said add-compare-select units and a set of outputs connected to the inputs of the candidate registers and the phase error registers.

13. A data storage write-read system based on magnetic recording, said system comprising: (a) controllable write channel; (b) data storage disk; (c) self-adjusting read channel; wherein said controllable write channel comprises; (a) connected in cascade RLL encoder and precoder, the input of the RLL encoder being used as the input of the controllable write channel; (b) connected in cascade write precompensation unit and write preamplifiers, the output of the write preamplifiers being used as the output of the controllable write channel; (c) a test generator; (d) a controllable switch with the first input, the second input and the output, the first input being connected to the output of the precoder, the second input being connected to the output of the test generator and the output being connected to the input of the write precompensation unit.

14. A data storage write-read system of the claim 13, wherein said controllable switch is configured to establish a connection between the first input and the output in the detecting mode and to establish a connection between the second input and the output in the training mode.

15. A data storage write-read system of the claim 13, wherein said test generator is configured to produce a test pattern that constitutes a sequence of basic blocks, each basic block comprising a preamble, an address mark and a number of repetitive sets of all nonzero binary combinations.

16. A data storage write-read system of the claim 15, wherein said test generator is configured to produce a test pattern that contains sets of pseudo random sequences as the sets of all nonzero binary combinations in each of the basic blocks.

17. A data storage write-read system of the claim 13, wherein said self-adjusting read channel comprises: (a) connected in cascade read preamplifiers, a low pass filter, an analog to digital converter, a high pass filter, the input of the read preamplifiers being used as the input of the self-adjusting read channel; (b) a RLL decoder with an output that is used as the output of the self-adjusting read channel; (c) a self-adjusting PRML receiver with an input that is connected to the output of the high pass filter and an output that is connected to the input of the RLL decoder.

* * * * *